May 21, 1957 R. E. THOMPSON 2,793,294

TUNER

Filed Feb. 6, 1956

INVENTOR.

Reynald E. Thompson

BY Mueller & Aichele

Atty's.

United States Patent Office 2,793,294
Patented May 21, 1957

2,793,294

TUNER

Reynald E. Thompson, Mount Prospect, Ill., assignor to Motorola, Inc., Chicago, Ill., a corporation of Illinois Application February 6, 1956, Serial No. 563,555

7 Claims. (Cl. 250—40)

Figure 1:
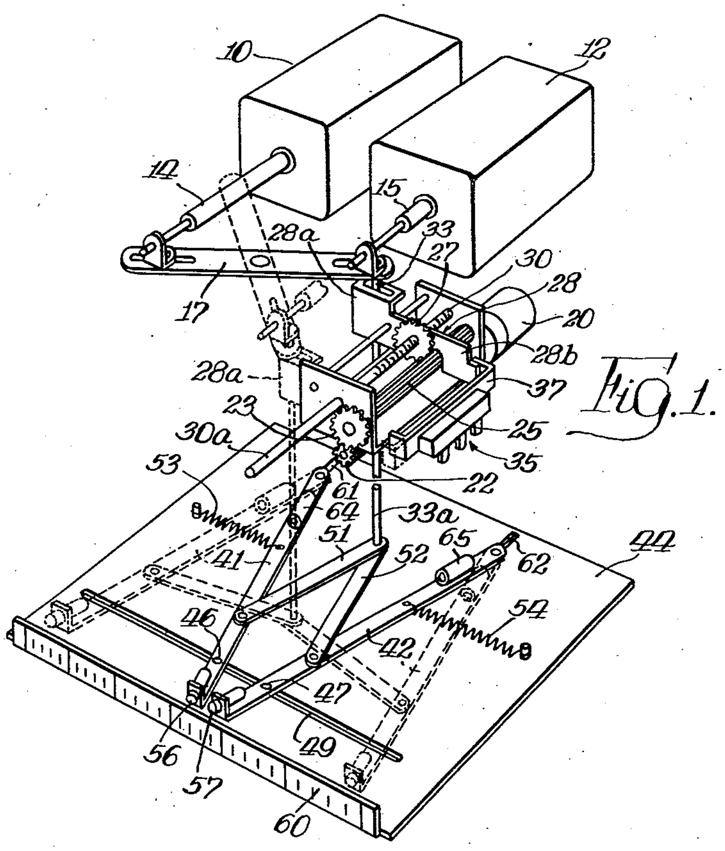

This invention relates to tuning apparatus for wave signal receivers and more particularly to such apparatus of a type useful with receivers tunable through a divided or dual frequency range.

Tunable wave signal receivers, such as radio and television receivers, often cover more than one tuning range. This may be due to engineering limitations in designing tuning circuits of wide enough frequency coverage for receivers operative over a continuous portion of the spectrum such as the so-called broadcast and short-wave receivers, or it may be necessitated because bands separated in the frequency spectrum are covered, such as in AM–FM receivers or in V. H. F.-U. H. F. television receivers. In either instance where more than one band is tunable, it may be desirable that an associated frequency indicating dial show only a continuous range through which tuning takes place even through more than one range is covered by the tuning apparatus. Thus, for example, a person using such apparatus could tune a television receiver across the several signal ranges by means of a single control and by viewing but a single indicator scale. However, such an arrangement might also require considerable time for station selection, even if motor driven, when a station is to be tuned at one end of the scale and the apparatus is at the time tuned near the other end of the scale. That is, if a system presenting a single tuning range is to be practical, some provision must be made for expediting the tuning process across an indicator dial or scale encompassing the equivalent of two or more usual ranges or bands.

It is an object of this invention to provide apparatus tunable through two ranges and capable of automatically transferring its operating frequency as well as an associated indicator from one end of a range to an end of the other range.

Another object of this invention is to provide signal tuning apparatus which indicates resonant frequencies in a plurality of tuning ranges upon a single continuous dial scale.

Still another object is to provide such tuning apparatus which electrically shifts rapidly from one end of a dual tuning range to the other end of the dual range without subjecting the apparatus to mechanical strain or shock.

A feature of the invention is the provision of tuning apparatus including dual pointers which are individually operative in different frequency bands of a scale and which are movable simultaneously in opposite directions across adjacent sections of the scale so that one may become functional when the other is in a position adjacent thereto thus giving continuity to the indicating mechanism. By selectively illuminating the pointers only the desired one will be apparent.

Another feature is the provision of tuning apparatus including reversible driving means for tuning circuits and scale pointers which are individually associated with the circuits and are movable to spaced positions by one driving direction and to adjacent positions by the other driving direction so that in each pointer position a different tuning circuit may be coupled for use by a switch operative at such times. Accordingly, each pointer is in its proper position when it is to become the indicator in use so that band change may be made rapidly and without mechanical strain on the apparatus.

Figure 2:
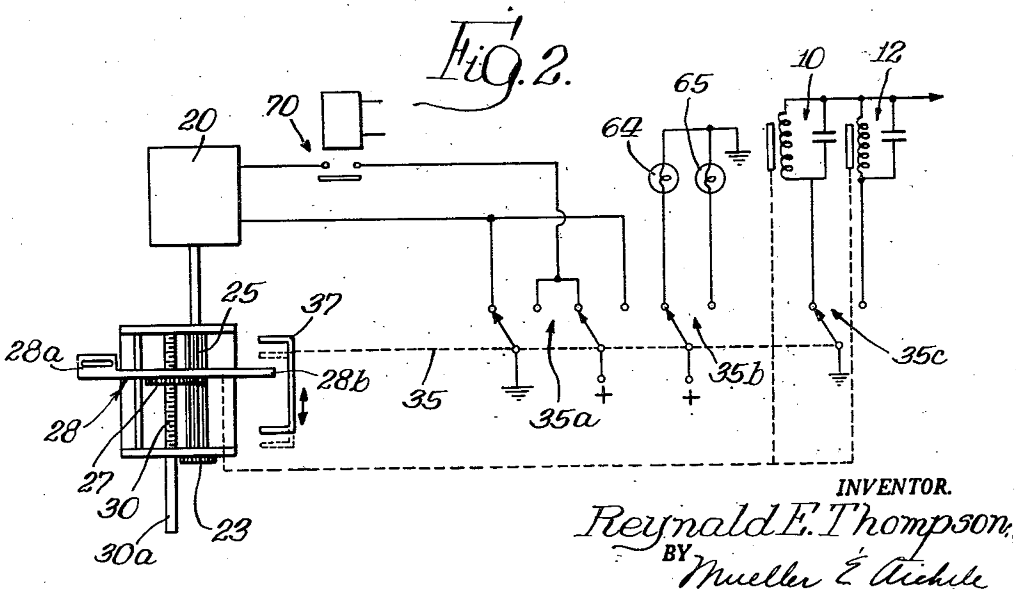

Additional objects, features and the attending advantages of the invention will be apparent upon consideration of the following description when taken in conjunction with the accompanying drawing in which:

Fig. 1 is a perspective view illustrating the tuning apparatus of the present invention; and Fig. 2 is a schematic diagram showing the electrical connection of the apparatus.

The invention provides tuning apparatus for wave signals. Two sets of tuning circuits or resonant devices are adapted to be simultaneously driven through different tuning ranges in opposite directions either by a reversible electric motor or manual power. A switch is operable at the extreme ends of the tuning ranges of each resonant device to connect a different one for utilization so that application of the drive power in each direction is associated with a resonant device. Two pointers or dial scale indicators are movable simultaneously and in opposite directions across a scale and movement of these pointers is controlled by the drive power. A light associated with each pointer is energized from power applied by the switch so that only the pointer indicating the setting of the operative resonant device is visible. Accordingly, as the drive power is applied in one direction for tuning purposes and the pointers travel toward one another, one tuning range is scanned and as the pointers are adjacent one another, the switch is operated and the drive power reverses, so the other resonant device is rendered operative, and the light on its pointer is energized. After scanning of the second band, the pointers are at extreme spaced positions and the switch again operates for electrically returning the apparatus to the first described condition, and the process may be repeated. If the drive power is manually applied, tuning is accomplished by the operator in the usual manner, while with motor drive power, suitable stop on signal or signal seeker circuitry may be used for control of the motor.

The tuning apparatus of Fig. 1 includes a pair of tuning circuits or resonant devices 10, 12 which are tuned to different frequencies by reciprocal movement of slugs 14, 15 respectively. The ends of a cross bar 17 pivotally mounted at its center join the slugs 14, 15 and move them simultaneously in opposite directions upon pivotal movement of the bar. As will be apparent upon further consideration of the apparatus the resonant devices 10, 12 may also be of different construction or may consist of a plurality of devices mechanically intercoupled or ganged in order to simultaneously tune several different circuits in associated radio apparatus. In the description being given it is contemplated that device 10 represents tuning apparatus for one frequency band and that device 12 represents tuning apparatus for a different frequency band.

The mechanism for driving the cross bar 17 includes a reversible electric motor 20 operation of which drives gear 22 which in turn drives gear 23. Gear 23 is mounted coaxially with a pinion stock member 25 which is thus driven by the motor 20. Member 25 engages the teeth of gear 27 on carriage 28. Gear 27 is also in engagement with worm 30 so that as motor 20 drives member 25, gear 27 is rotated and moved axially along the worm 30 thus driving carriage 28 forward or backward depending upon the direction of rotation motor 20. A frame 21 provides support for the entire mechanism. Carriage 28 includes a slotted portion 28*a* which engages a pin 33 for the purpose of driving cross bar 17 as the carriage is driven. Thus, through energization of motor 20 and travel of carriage 28 between extreme forward and backward positions thereof, resonant devices 10, 12 are driven throughout their respective tuning ranges.

A switch 35 is provided for several functions to be fully explained later, one of which is to cause reversal of the motor when carriage 28 has reached a maximum forward or backward position. An arm 28*b* on carriage 28 extends outwardly of frame 21 in order to engage switch actuator 37 and move this actuator when the carriage has reached a maximum position. Accordingly, the motor automatically reverses due to the operation of switch 35 and continuous energization of the motor would continually scan the resonant devices 10, 12 through their respective ranges. Worm 30 includes an extension 30*a* which forms a manual tuning shaft so that it is also possible to drive devices 10, 12 through manual rotation of shaft 30*a*. During such operation there is sufficient friction in the motor driving apparatus and associated gears that gear 27 does not rotate but rather slides along the teeth of pinion stock member 25 so that carriage 28 travels as worm 30 is rotated. When the carriage has been moved to an extreme forward or rearward position, during manual operation, switch 35 is actuated and it is of course necessary to rotate shaft 30*a* in the opposite direction in order to return the carriage. That is, during manual operation of the apparatus, the operator must provide the reversing drive power otherwise furnished by the motor 20.

The tuning apparatus also includes a pair of indicator arms 41, 42, corresponding ends of which are pivotally and slidably mounted in spaced positions on base plate 44. Pins 46, 47 mounted near the opposite ends of arms 41, 42 respectively ride in a guide slot 49 of base 44. A linking bar 51 is pivotally secured to arm 41 and linking bar 52 is similarly secured to arm 42. The free ends of bars 51, 52 are pivotally joined to an extension 33*a* of pin 33 which is driven forward and backward by carriage 28. Accordingly, it may be seen that as the carriage 28 moves forward, arms 41, 42 will pivot from a position where the ends thereof are adjacent to a position where these ends are spaced apart by a maximum amount. A pair of springs 53, 54 bias arms 41, 42 to the open position in order to assist in the drive of these arms at a time when the outward component of force applied by linking bars 51, 52 is at a minimum. It is also obvious that as the carriage 28 moves rearwardly, the ends of arms 41, 42 will be drawn together by members 51, 52 from the spaced (dotted) position to the adjacent position in full lines.

The free ends of arms 41, 42 carry plastic rods 56, 57 which move parallel to and just behind the dial plate 60. It may be noted that pins 46, 47 riding in slot 49 maintain rods 56, 57 in close proximity to the scale or plate 60 and that slots 61, 62 in which the pivoted ends of arms 41, 42 are mounted, provide the necessary "take-up" so that rods 56, 57 travel in a straight line rather than an arcuate path. Near the pivotally mounted ends of arms 41, 42 are mounted electric light devices 64, 65 which are directed respectively at plastic rods 56, 57. It is contemplated that the rods be of a type to concentrate the light along scale plate 60, which is translucent, so that a light spot will appear on this plate when either light device is energized.

Turning now to Fig. 2 in which there is shown a schematic diagram of the wiring of the device, it may be seen that switch 35 includes a double-pull double-throw portion 35*a* used to reverse the motor 20 when the switch actuator 37 is operated by the carriage 28. Switch 35 also includes a single-pull double-throw portion 35*b* which alternately operates lamp devices 64, 65, as well as a portion 35*c* which alternately renders operative resonant devices 10, 12. Accordingly, when switch 35 is in one position, the motor will travel in a given direction, and light device 64 will be energized and device 10 will be operatively connected to associated radio equipment (not shown). However, when the carriage 28 has been moved to a position to operate switch 35 the motor will reverse and light device 65 and tuning device 12 will become operative.

As previously explained the carriage, and thus operation of the complete tuning apparatus, may take place either through manual rotation of shaft 30*a* or alternatively through operation of reversible electric motor 20. In order to operate motor 20 relay 70 may be energized by suitable circuitry not shown to complete the circuit to this motor. In such a case, it is contemplated that additional circuitry also not shown, may be used to automatically de-energize relay 70 when a station has been tuned by apparatus in which devices 10, 12 are utilized. As familiar to those in the art, such circuitry would be of the stop-on-signal, or signal seeking type, the operation of which is known and not explained herein since the present invention is not concerned with the particular system utilized for stopping and starting motor 20.

Considering now complete operation of the system, it may be assumed that motor 20 is energized and driving carriage 28 to the rear in Fig. 1, that devices 64 and 10 are operative and thus that a light spot is travelling to the right across the left hand portion of dial plate 60. Such a concentrated light spot is provided by plastic rod 56 and of course indicates on plate 60 the frequencies covered by device 10. Further assuming that operation of the apparatus continues and that no station is tuned to cause automatic stopping of the mechanism, the condition described will prevail until carriage 28 has reached its extreme rearward position at which time switch 35 will be operated and rod 56 will be adjacent rod 57 as shown by the solid lines in Fig. 1. At such time, of course, the light device 65 and the tuning device 12 will become operative, the motor will reverse and the light spot indicating a tuned frequency will continue travelling to the right in Fig. 1 as plastic rod 57 travels across dial plate 60. This operation of course continues until the carriage 28 has moved to its extreme forward position at which time indicator arms 41, 42 will be in the dotted position and switch 35 will again be operated. In this instance, the devices 64 and 10 will again become operative and the spot indicating a tuned frequency will then be at the extreme left of the scale plate 60 and carriage 28 will again move toward the rearward position as the process is repeated.

Accordingly, it may be seen that the apparatus provides a single continuous dial which indicates a tuned frequency in a plurality of bands as selected by a plurality of tuning circuits. A single manual or electrical control may be used by an operator to effect tuning across such a plurality of ranges and without resorting to operation of separate switching devices. Furthermore, the apparatus is capable of immediately transferring between extreme ends of the bands through very rapid operation. This "snapback" or rapid restart of the scanning range is done electrically in the system and without undue strain on the mechanical apparatus of the device since the indicator arm not in use moves into a position for use before it actually becomes operative.

I claim:

1. Tuning apparatus including in combination first and second variable tuning means, reversible driving means for operating said tuning means through respective tuning ranges, indicator means having first and second indicating portions individually associated with said tuning means to indicate the tuned positions thereof, said indicator means including linking means operated by said driving means for moving said indicating portions from positions adjacent each other to positions spaced from each other and back to positions adjacent to each other as said driving means is operated in one direction and then returned in the opposite direction, and switch means adapted to selectively couple said first and second tuning means for utilization as said indicating portions reach said spaced and said adjacent positions.

2. A dual band tuner including in combination first and second variable tuning elements, driving means movable between first and second positions, means coupling said tuning elements to said driving means for operating the same through their respective tuning ranges, indicator means operated by said driving means and having first and second indicating portions, said indicator means including a scale and linking means for moving said first and second indicating portions across adjacent portions of said scale, said linking means moving said indicating portions from positions adjacent each other to positions spaced from each other as said driving means moves from said first position to said second position and moving said indicating portions from spaced positions to adjacent positions as said driving means moves from said second position to said first position, and switch means adapted to selectively couple said first and second tuning elements for utilization as said driving means reaches said first and second positions respectively.

3. Tuning apparatus including in combination first and second variable tuning means, reversible electric motor means for simultaneously operating said tuning means through respective tuning ranges, indicator means having first and second indicating portions individually associated with said tuning means to indicate the tuned positions thereof, said indicator means including linking means operated by said motor means for moving said indicating portions from positions adjacent each other to positions spaced from each other and back to positions adjacent to each as said motor means is operated in one direction and then reversed in the opposite direction, and switch means adapted to selectively couple said first and second tuning means for utilization and to reverse said electric motor means as said indicating portions reach said spaced and said adjacent positions.

4. A dual band tuner including in combination first and second variable tuning means, driving means reversibly movable between first and second positions, means coupling said tuning means to said driving means for operating the same through their respective tuning ranges, indicator means coupled to said driving means and having first and second indicating portions, said indicator means including a scale and linking means for moving said first and second indicating portions across adjacent portions of said scale, electric lights associated with said indicator portions and energizable to render the positions of said indicator portions visible on said scale, said linking means moving said indicating portions from positions adjacent each other to postions spaced from each other as said driving means moves from said first position to said second position and moving said indicating portions from spaced positions to adjacent positions as said driving means moves from said second position to said first position, and switch means operable as said driving means reaches said first and second positions respectively to selectively couple said first and second tuning means for utilization and to selectively energize a light on one of said indicator portions.

5. Tuning apparatus including in combination first and second variable tuning means, reversible driving means for simultaneously operating said tuning means through respective tuning ranges, indicator means having first and second slidable arms individually and respectively associated with said tuning means to indicate the tuned positions thereof, said indicator means including linking means operated by said driving means for moving said arms toward a spaced position and away from an adjacent position and for moving the same away from a spaced position and toward an adjacent position as said driving means is operated in respective opposite directions, said indicator means further including an electric light supported on each of said first and second arms to be energized for rendering the positions thereof visible, and switch means adapted to selectively couple said first and second tuning means for utilization and to selectively energize the lights on said first and second arms as said arms respectively reach said spaced position and said adjacent position.

6. A dual band tuner including in combination first and second variable tuning means, reversible driving means for operating said tuning means simultaneously and in opposite directions through their respective tuning ranges, a dial scale, a pair of movable indicator arms individually associated with said first and second tuning means, means linking said indicator arms to said driving means to be driven simultaneously thereby, said indicator arms having end portions movable toward and away from each other across said scale, lighting means associated with said indicator arms to selectively illuminate the positions thereof, and switch means operable by said driving means in the extreme spaced position of said indicator arms to couple said first tuning means for utilization and operable in the extreme adjacent position of said indicator arms to couple said second tuning means for utilization.

7. A dual band tuner including in combination first and second variable tuning means, reversible driving means for operating said tuning means simultaneously and in opposite directions through their respective tuning ranges, a dial scale, a pair of pivotally and slidably mounted indicator arms individually associated with said first and second tuning means, said indicator arms being linked to said driving means to be driven simultaneously thereby and having end portions movable toward and away from each other across said scale, electric light means carried by said arms and energizable to illuminate the positions thereof, and switch means operable by said driving means in the extreme spaced position of said indicator arms to couple said first tuning means for utilization and to energize the light means on the associated indicator arm thereof and operable in the extreme adjacent position of said indicator arms to couple said second tuning means for utilization and to energize the light means on the associated arm thereof.

No references cited.